US012635348B2

(12) United States Patent
Lim et al.

(10) Patent No.: US 12,635,348 B2
(45) Date of Patent: May 19, 2026

(54) DISPLAY APPARATUS HAVING A LIGHT-EMITTING DEVICE

(71) Applicant: LG Display Co., Ltd., Seoul (KR)

(72) Inventors: Young Nam Lim, Paju-si (KR); Se Hong Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 344 days.

(21) Appl. No.: 18/243,509

(22) Filed: Sep. 7, 2023

(65) Prior Publication Data

US 2024/0260322 A1    Aug. 1, 2024

(30) Foreign Application Priority Data

Feb. 1, 2023    (KR) ........................ 10-2023-0013433

(51) Int. Cl.
| | |
|---|---|
| *H10K 50/858* | (2023.01) |
| *H10K 59/122* | (2023.01) |
| *H10K 59/38* | (2023.01) |
| *H10K 59/80* | (2023.01) |
| *H10K 77/10* | (2023.01) |
| *H10K 102/00* | (2023.01) |

(52) U.S. Cl.
CPC .......... *H10K 59/122* (2023.02); *H10K 59/38* (2023.02); *H10K 59/873* (2023.02); *H10K 59/879* (2023.02); *H10K 59/8792* (2023.02); *H10K 77/10* (2023.02); *H10K 2102/302* (2023.02)

(58) Field of Classification Search
CPC ........................... H10K 59/879; H10K 50/858
USPC ..................................................... 313/498–512
See application file for complete search history.

(56) References Cited

U.S. PATENT DOCUMENTS

| | | | | |
|---|---|---|---|---|
| 2015/0069361 A1* | 3/2015 | Sato | ..................... | H10K 71/211 |
| | | | | 438/34 |
| 2021/0135166 A1* | 5/2021 | Baek | ..................... | G06F 3/0445 |
| 2024/0244937 A1* | 7/2024 | Jin | ........................ | H10K 59/873 |
| 2024/0357850 A1* | 10/2024 | Kajimoto | ............... | H05B 33/24 |

FOREIGN PATENT DOCUMENTS

| | | | | | |
|---|---|---|---|---|---|
| CN | 120345389 A | * | 7/2025 | ............. | H10K 59/35 |
| JP | 2004-317602 A | | 11/2004 | | |
| JP | 2012-199062 A | | 10/2012 | | |
| KR | 10-2009-0126597 A | | 12/2009 | | |
| KR | 10-2020-0017622 A | | 2/2020 | | |
| KR | 10-2022-0033770 A | | 3/2022 | | |

* cited by examiner

*Primary Examiner* — Christopher M Raabe
(74) *Attorney, Agent, or Firm* — Birch, Stewart, Kolasch & Birch, LLP

(57) ABSTRACT

A display apparatus including a light-emitting device is discussed. A device planarization layer, a plurality of micro-lenses, a color filter, a black matrix and an optical lens can be disposed on the light-emitting device. The color filter and the optical lens can overlap the light-emitting device. The black matrix can be disposed side by side with the color filter between the light-emitting device and the optical lens. An upper surface of each micro-lens toward the color filter can include a lens groove. The lens groove of each micro-lens can have a conical shape with a concave side. Thus, in the display apparatus, luminance and efficiency according to a viewing angle can be improved.

15 Claims, 13 Drawing Sheets

Cst

DC

300 relative luminance viewing angle (°)

DISPLAY APPARATUS HAVING A LIGHT-EMITTING DEVICE

CROSS-REFERENCE TO RELATED APPLICATIONS

This application claims priority to Korean Patent Application No. 10-2023-0013433, filed in the Republic of Korea on Feb. 1, 2023, the entire disclosure of which is hereby expressly incorporated by reference into the present application.

BACKGROUND OF THE DISCLOSURE

Field

The present disclosure relates to a display apparatus in which a light-emitting device is disposed in each pixel area.

Discussion of the Related Art

Generally, a display apparatus provides an image to a user. For example, the display apparatus can include a light-emitting device disposed in each pixel area. The light-emitting device of each pixel area can emit light displaying a specific color. For example, the light-emitting device of each pixel area can include a light-emitting layer disposed between a first electrode and a second electrode.

The display apparatus can realize the image of various colors by using a color filter. The color filter can be disposed on the light-emitting device of each pixel area. The color filter can be disposed side by side with a black matrix. The black matrix can include an opening overlapping with the light-emitting device of each pixel area. A traveling direction of light emitted from the light-emitting device in each pixel area can be restricted by the black matrix. Thus, in the display apparatus, mixed color can be prevented.

However, in the display apparatus, the luminance of the image provided to the user located in an inclined direction can be greatly reduced by the black matrix. That is, in the display apparatus, the luminance of the image can be significantly decreased as a viewing angle increases. Therefore, in the display apparatus, quality deviation or quality deterioration of the image according to a viewing location of the user can be increased.

SUMMARY OF THE DISCLOSURE

Accordingly, the present disclosure is directed to a display apparatus that substantially obviates one or more problems due to limitations and disadvantages of the related art.

An object of the present disclosure is to provide a display apparatus capable of reducing the luminance deviation according to the viewing location of a user.

Additional advantages, objects, and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising a device substrate. A bank insulating layer and a light-emitting device are disposed on the device substrate. The bank insulating layer defines an emission area in a pixel area. The light-emitting device is disposed on the emission area. A device planarization layer is disposed on the bank insulating layer and the light-emitting device. A plurality of micro-lenses is disposed on the device planarization layer of the pixel area. An upper surface of each micro-lens opposite to the device substrate includes a lens groove. The lens groove of each micro-lens has a conical shape with a concave side. A color filter is disposed on the plurality of the micro-lenses. The color filter is disposed side by side with a black matrix. The black matrix overlaps the bank insulating layer. An optical lens is disposed on the color filter. The color filter and the optical lens overlap the emission area.

According to an aspect of the present disclosure, a cross-section of each micro-lens can have a shape in which two curved surfaces are disposed symmetrically with respect to the corresponding lens groove.

According to an aspect of the present disclosure, a plane of a lower surface of each micro-lens toward the device substrate can have a circular shape. A plane of an upper surface of each micro-lens can have a ring shape. A planar arrangement of the micro-lenses can have a hexagonal shape.

According to an aspect of the present disclosure, the plurality of the micro-lenses can include a same material as the device planarization layer. The lens groove of each micro-lens can be spaced apart from a lens center of the corresponding micro-lens.

According to an aspect of the present disclosure, a distance between the lens center and the lens groove in each micro-lens can be 10% or less of the maximum thickness of the corresponding micro-lens.

According to an aspect of the present disclosure, an edge of one of the micro-lenses can be vertically aligned with an edge of the optical lens. The bank insulating layer can include a black dye.

According to an aspect of the present disclosure, the color filter and the black matrix can be covered by a color planarization layer. A lower surface of the optical lens toward the device substrate can contact the color planarization layer.

According to an aspect of the present disclosure, an encapsulation unit can be disposed between the micro-lenses and the color filter. The encapsulation unit can extend between the micro-lenses and the black matrix. Touch electrodes can be disposed between the encapsulation unit and the black matrix.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings:

FIG. 1 is a view schematically showing a display apparatus according to an embodiment of the present disclosure;

FIG. 2 is a view showing a circuit of a unit pixel area in the display apparatus according to the embodiment of the present disclosure;

Figure 14:
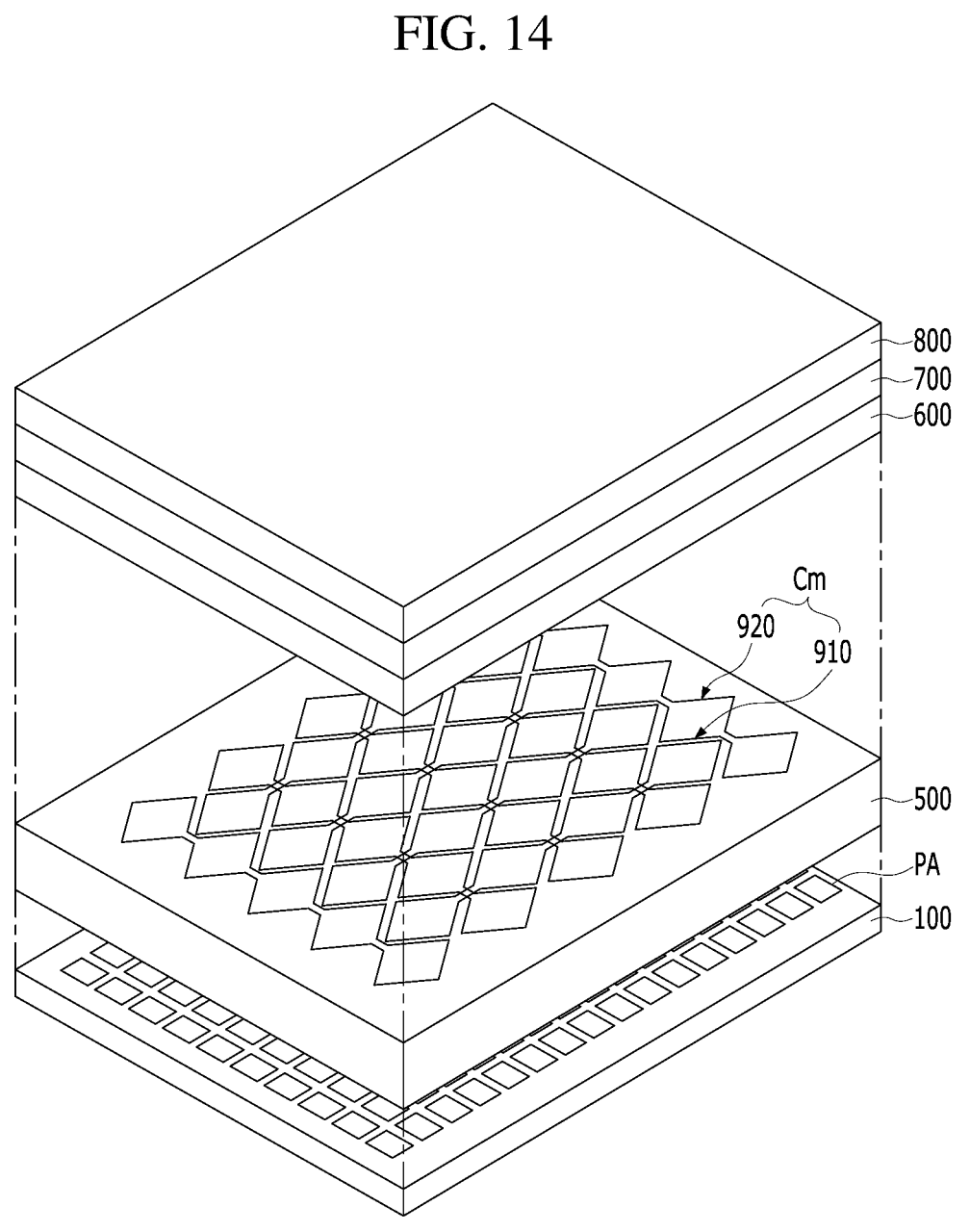
Figure 16:
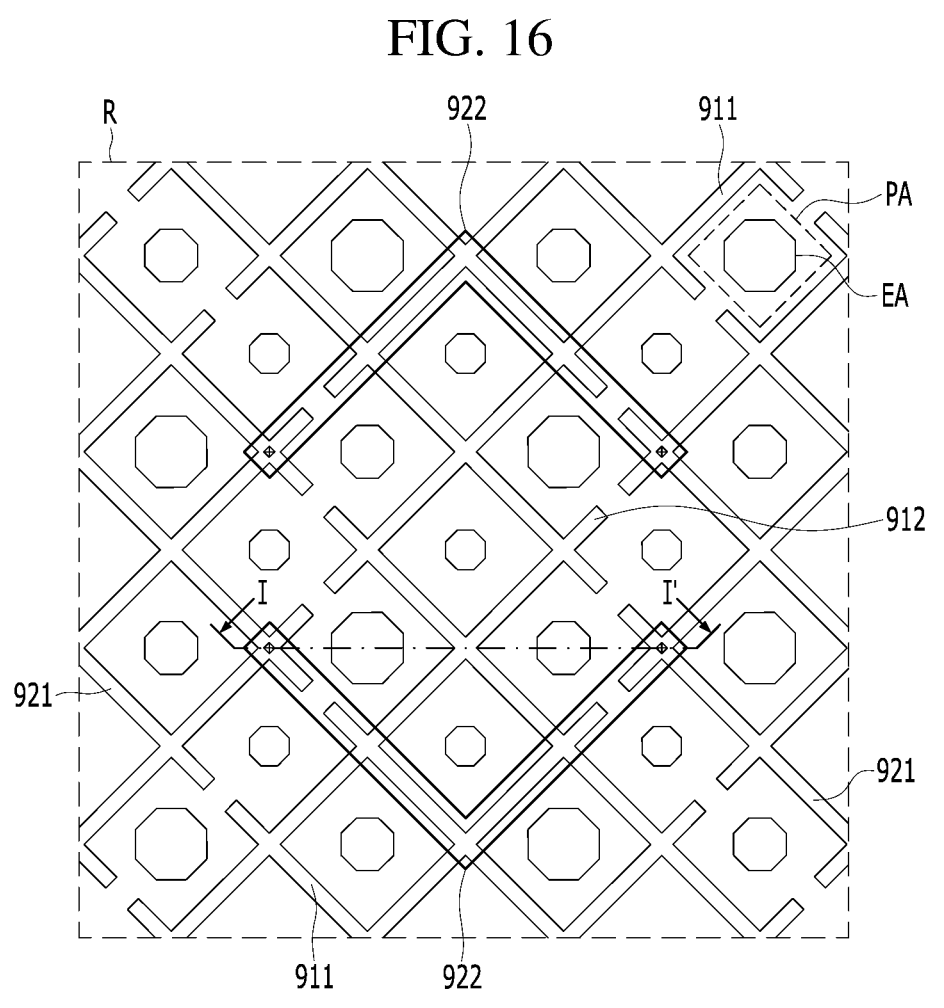

FIGS. 11 to 17 are views showing a display apparatus according to further another embodiment of the present disclosure.

DETAILED DESCRIPTION OF THE EMBODIMENTS

Figure 3:
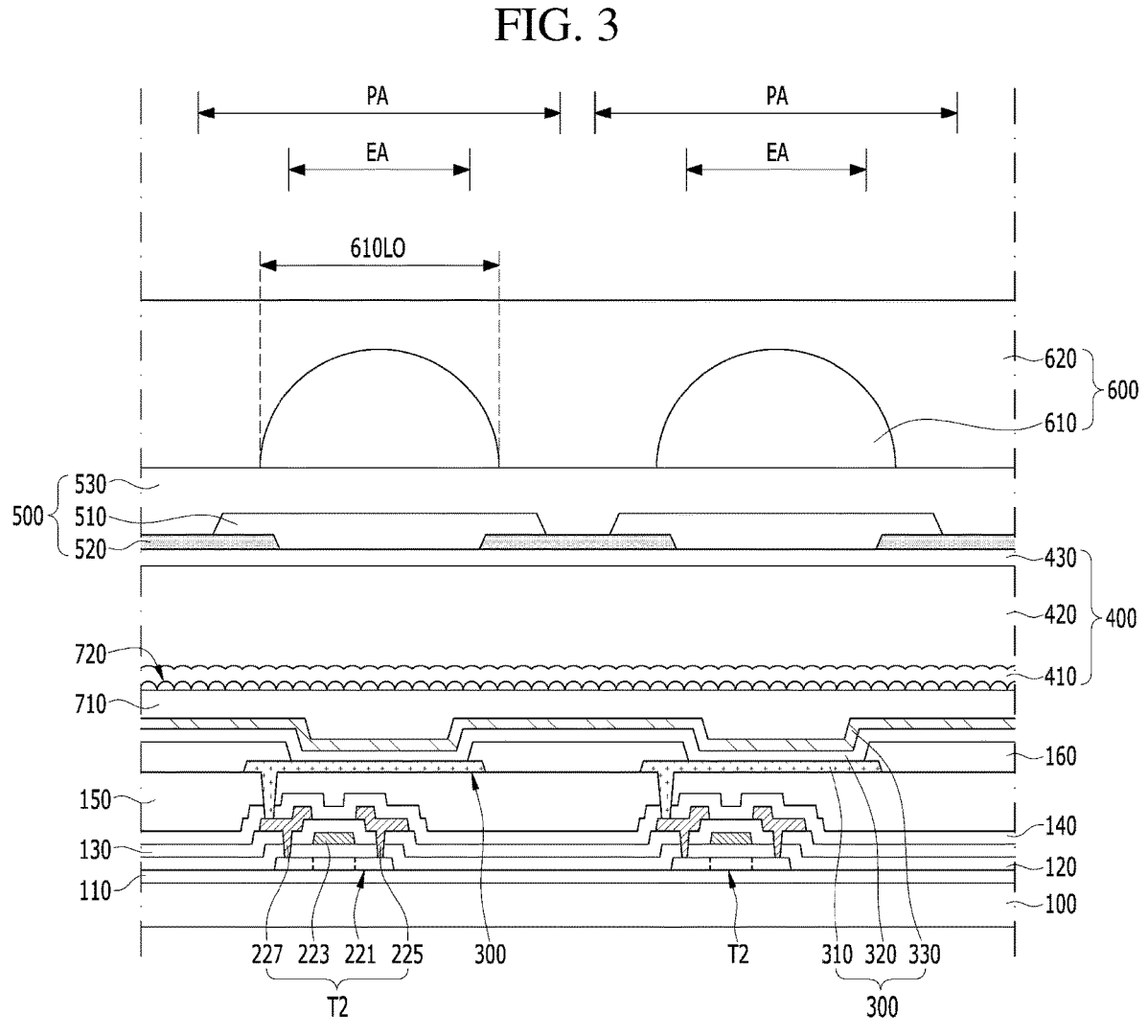
FIG. 3 is a view showing a cross-section of a pixel area in the display apparatus according to the embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure can be embodied in other forms and is not limited to the embodiments described below.

In addition, the same or extremely similar elements can be designated by the same reference numerals throughout the specification and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element, and may not define order or sequence. However, the first element and the second element can be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Further, unless 'directly' is used, the terms "connected" and "coupled" can include that two components are "connected" or "coupled" through one or more other components located between the two components. In addition, the same or similar elements can be designated with the same or similar reference numerals and the description of the same elements may be omitted for the sake of brevity.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein. Further, all the components of each display apparatus according to all embodiments of the present disclosure are operatively coupled and configured.

Embodiments

Figure 1:
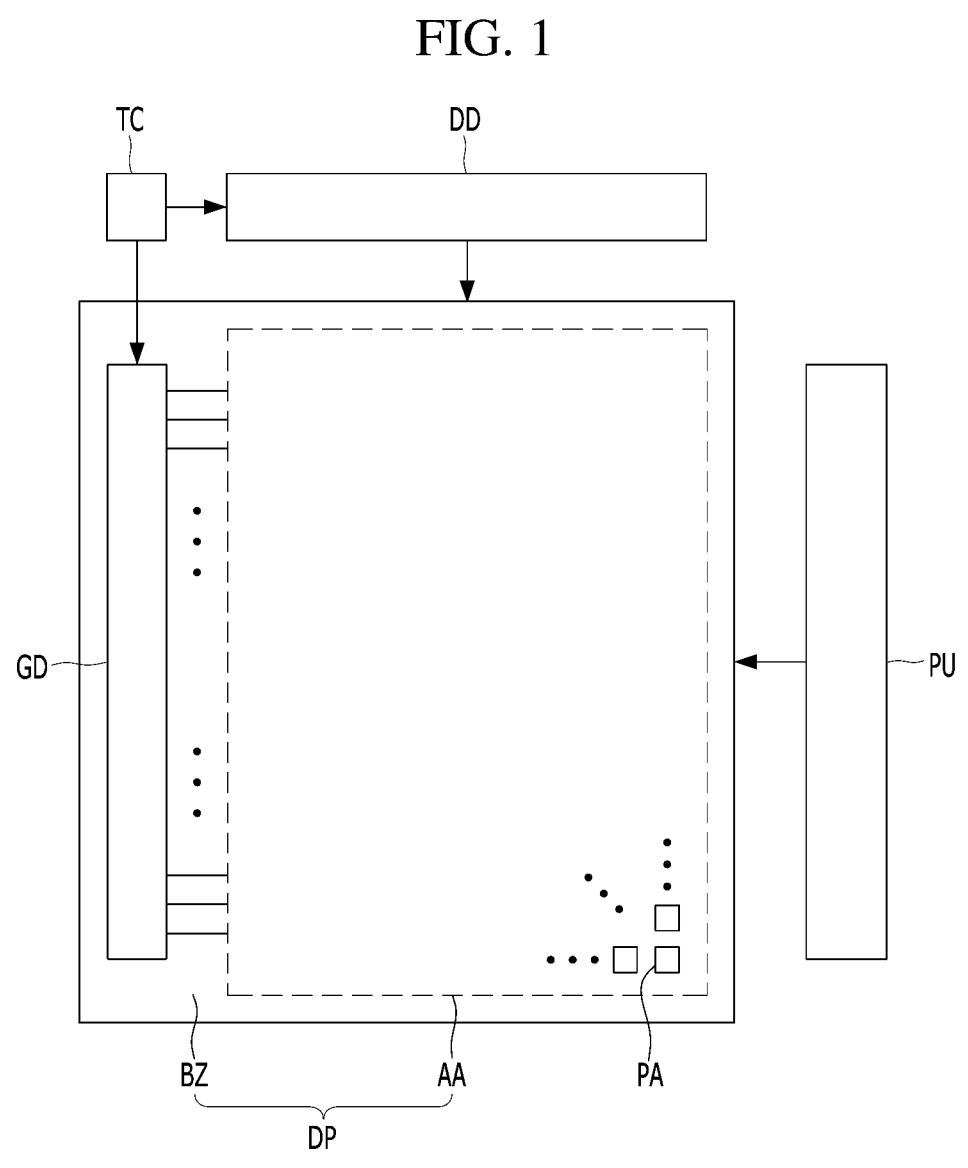
Figure 2:
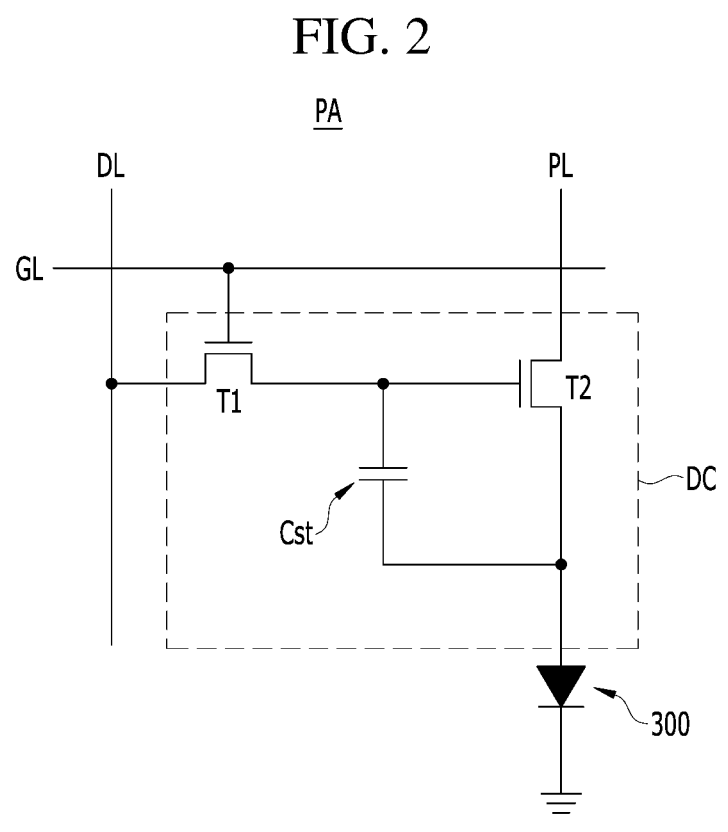

FIG. 1 is a view schematically showing a display apparatus according to an embodiment of the present disclosure. FIG. 2 is a view showing a circuit of a unit pixel area in the display apparatus according to the embodiment of the present disclosure. FIG. 3 is a view showing a cross-section of a pixel area in the display apparatus according to the embodiment of the present disclosure.

Referring to FIGS. 1 to 3, the display apparatus according to the embodiment of the present disclosure can include a display panel DP. The display panel DP can generate an image provided to a user. For example, the display panel DP can include a plurality of pixel areas PA.

Various signals can be applied to each pixel area PA through signal wirings GL, DL and PL. For example, the signal wirings GL, DL and PL can include gate lines GL sequentially applying a gate signal to each pixel area PA, data lines DL applying a data signal to each pixel area PA, and power voltage supply lines PL supplying a power voltage to each pixel area PA. The gate lines GL can be electrically connected to the gate driver GD, and the data lines DL can be electrically connected to the data driver DD. The gate driver GD and the data driver DD can be controlled by a timing controller TC. For example, the gate driver GD can receive clock signals, reset signals and a start signal from the timing controller TC, and the data driver DD can receive digital video data and a source timing signal from the timing controller TC. The power voltage supply lines PL can be electrically connected to the power unit PU.

The display panel DP can include a display area (or active area) AA in which the pixel areas PA are disposed, and a bezel area BZ disposed outside the display area AA. A non-display (or non-active area) can surround the display area AA and can include the bezel area BZ. At least one of the gate driver GD, the data driver DD, the timing controller TC and the power unit PU can be disposed on the bezel area BZ of the display panel DP. For example, the display apparatus according to the embodiment of the present disclosure can be a GIP (Gate In Panel) type display apparatus in which the gate driver GD is formed on the bezel area BZ of the display panel DP.

Each of the pixel areas PA can realize a specific color. For example, a light-emitting device 300 and a pixel driving circuit DC electrically connected to the light-emitting device 300 can be disposed in each pixel area PA. The light-emitting device 300 and the pixel driving circuit DC of each pixel area PA can be disposed on a device substrate 100. The device substrate 100 can include an insulating material. For example, the device substrate 100 can include glass or plastic.

The pixel driving circuit DC of each pixel area PA can supply a driving current corresponding to the data signal to the light-emitting device 300 of the corresponding pixel area PA according to gate signal for one frame. For example, the pixel driving circuit DC of each pixel area PA can include a first thin film transistor T1, a second thin film transistor T2 and a storage capacitor Cst.

The first thin film transistor T1 can include a first semiconductor pattern, a first gate electrode, a first drain electrode and a first source electrode. The first thin film transistor T1 can transmit the data signal to the second thin film transistor T2 according to the gate signal. For example, the first thin film transistor T1 can be a switching thin film transistor. The first gate electrode can be electrically connected to one of the gate lines GL, and the first drain electrode can be electrically connected to one of the date lines DL.

The first semiconductor pattern can be disposed close to the device substrate 100. The first semiconductor pattern can include a semiconductor material. For example, the first semiconductor pattern can include amorphous silicon (a-Si), polycrystalline silicon (Poly-Si) or an oxide semiconductor, such as IGZO. The first semiconductor pattern can include a first drain region, a first channel region and a first source region. The first channel region can be disposed between the first drain region and the first source region. The first drain region and the first source region can have a resistance lower than the first channel region. For example, the first drain region and the first source region can include a conductive region of an oxide semiconductor. The first channel region can be a region of an oxide semiconductor, which is not conductorized.

The first gate electrode can be disposed on the first semiconductor pattern. For example, the first gate electrode can overlap the first channel region of the first semiconductor pattern. The first drain region and the first source region of the first semiconductor pattern can be disposed outside the first gate electrode. The first gate electrode can include a conductive material. For example, the first gate electrode can include a metal, such as aluminum (Al), chrome (Cr), copper (Cu), molybdenum (Mo), titanium (Ti) and tungsten (W). The first gate electrode can be insulated from the first semiconductor pattern. For example, the first source region of the first semiconductor pattern can be electrically connected to the first drain region of the first semiconductor pattern according to a voltage applied to the first gate electrode.

The first drain electrode can include a conductive material. For example, the first drain electrode can include a metal, such as aluminum (Al), chrome (Cr), copper (Cu), molybdenum (Mo), titanium (Ti) and tungsten (W). The first drain electrode can include a material different from the first gate electrode. The first drain electrode can be disposed on a layer different from the first gate electrode. For example, the first drain electrode can be insulated from the first gate electrode. The first drain electrode can be electrically connected to the first drain region of the first semiconductor pattern.

The first source electrode can include a conductive material. For example, the first source electrode can include a metal, such as aluminum (Al), chrome (Cr), copper (Cu), molybdenum (Mo), titanium (Ti) and tungsten (W). The first source electrode can include a material different from the first gate electrode. The first source electrode can be disposed on a layer different from the first gate electrode. For example, the first source electrode can be disposed on a same layer as the first drain electrode. The first source electrode can include a same material as the first drain electrode. For example, the first source electrode can be formed simultaneously with the first drain electrode. The first source electrode can be insulated from the first gate electrode. The first source electrode can be electrically connected to the first source region of the first semiconductor pattern.

The second thin film transistor T2 can include a second semiconductor pattern 221, a second gate electrode 223, a second drain electrode 225 and a second source electrode 227. The second thin film transistor T2 can generate the driving current corresponding to the data signal. For example, the second thin film transistor T2 can be a driving thin film transistor. The second gate electrode 223 can be electrically connected to the first source electrode, the second drain electrode 225 can be electrically connected to one of the power voltage supply lines PL.

The second semiconductor pattern 221 can be disposed close to the device substrate 100. The second semiconductor pattern 221 can include a semiconductor material. For example, the second semiconductor pattern 221 can include amorphous silicon (a-Si), polycrystalline silicon (poly-Si) or an oxide semiconductor, such as IGZO. The second semiconductor pattern 221 can include a same material as the first semiconductor pattern. The second semiconductor pattern 221 can be disposed on a same layer as the first semiconductor pattern. For example, the second semiconductor pattern 221 can be formed simultaneously with the first semiconductor pattern.

The second semiconductor pattern 221 can include a second channel region between a second drain region and a second source region. The second channel region can have a resistance larger than the second drain region and the second source region. For example, the second drain region and the second source region can include a conductive region of an oxide semiconductor. The second channel region can be a region of an oxide semiconductor, which is not conductorized. The second drain region and the second source region can have a same resistance as the first drain region and the first source region, and the second channel region can have a same resistance as the first channel region.

The second gate electrode 223 can be disposed on the second semiconductor pattern 221. For example, the second gate electrode 223 can overlap the second channel region of the second semiconductor pattern 221. The second drain region and the second source region of the second semiconductor pattern 221 can be disposed outside the second gate electrode 223. The second gate electrode 223 can include a conductive material. For example, the second gate electrode 223 can include a metal, such as aluminum (Al), chrome (Cr), copper (Cu), molybdenum (Mo), titanium (Ti) and tungsten (W). The second gate electrode 223 can include a same material as the first gate electrode. The second gate electrode 223 can be disposed on a same layer as the first gate electrode. For example, the second gate electrode 223 can be formed simultaneously with the first gate electrode. The second gate electrode 223 can be insulated from the second semiconductor pattern 221. For example, the second channel region of the second semiconductor pattern 221 can have an electrical conductivity corresponding to a voltage applied to the second gate electrode 223.

The second drain electrode 225 can include a conductive material. For example, the second drain electrode 225 can include a metal, such as aluminum (Al), chrome (Cr), copper (Cu), molybdenum (Mo), titanium (Ti) and tungsten (W). The second drain electrode 225 can include a material different from the second gate electrode 223. The second drain electrode 225 can be disposed on a layer different from the second gate electrode 223. For example, the second drain electrode 225 can be disposed on a same layer as the first drain electrode. The second drain electrode 225 can include a same material as the first drain electrode. For example, the second drain electrode 225 can be formed simultaneously with the first drain electrode. The second drain electrode 225 can be insulated from the second gate electrode 223. The second drain electrode 225 can be electrically connected to the second drain region of the second semiconductor pattern 221.

The second source electrode 227 can include a conductive material. For example, the second source electrode 227 can include a metal, such as aluminum (Al), chrome (Cr), copper (Cu), molybdenum (Mo), titanium (Ti) and tungsten (W). The second source electrode 227 can include a material different from the second gate electrode 223. The second source electrode 227 can be disposed on a layer different from the second gate electrode 223. The second source electrode 227 can be disposed on a same layer as the second drain electrode 225. For example, the second source electrode 227 can include a same material as the second drain electrode 225. For example, the second source electrode 227 can be formed simultaneously with the second drain electrode 225. The second source electrode 227 can be insulated from the second gate electrode 223. The second source electrode 227 can be electrically connected to the second source region of the second semiconductor pattern 221.

The storage capacitor Cst can maintain a signal applied to the second gate electrode 223 of the second thin film transistor T2 for one frame. For example, the storage capacitor Cst can be electrically connected between the second gate electrode 223 and the second source electrode 227 of the second thin film transistor T2. The storage capacitor Cst can have a stacked structure of capacitor electrodes. The storage capacitor Cst can be formed using a process of forming the first thin film transistor T1 and the second thin film transistor T2. For example, the storage capacitor Cst can include a first capacitor electrode formed simultaneously with the first gate electrode 223 and a second capacitor electrode formed simultaneously with the second source electrode 227. Thus, in the display apparatus according to the embodiment of the present disclosure, process efficiency can be improved.

A plurality of insulating layers 110, 120, 130, 140, 150 and 160 for preventing unnecessary electrical connection in each pixel area PA can be disposed on the device substrate 100. For example, a device buffer layer 110, a gate insulating layer 120, an interlayer insulating layer 130, a device passivation layer 140, a lower planarization layer 150 and a bank insulating layer 160 can be disposed on the device substrate 100.

The device buffer layer 110 can be disposed close to the device substrate 100. The device buffer layer 110 can prevent pollution due to the device substrate 100 in a process of forming the pixel driving circuit DC in each pixel area PA. For example, an upper surface of the device substrate 100 toward the pixel driving circuit DC of each pixel area PA can be completely covered by the device buffer layer 110.

The first thin film transistor T1, the second thin film transistor T2 and the storage capacitor Cst of each pixel area PA can be disposed on the device buffer layer 110. The device buffer layer 110 can include an insulating material. For example, the device buffer layer 110 can include an inorganic insulating material, such as silicon oxide (SiOx) and silicon nitride (SiNx). The device buffer layer 110 can have a multi-layer structure. For example, the device buffer layer 110 can have a stacked structure of an inorganic insulating layer made of silicon oxide (SiOx) and an inorganic insulating layer made of silicon nitride (SiNx).

The gate insulating layer 120 can be disposed on the device buffer layer 110. The gate insulating layer 120 can insulate the gate electrodes 223 of each pixel area PA from the corresponding semiconductor pattern 221. For example, the gate insulating layer 120 can cover the first semiconductor pattern and the second semiconductor pattern 221 of each pixel area PA. The first gate electrode and the second gate electrode 223 of each pixel area PA can be disposed on the gate insulating layer 120. The gate insulating layer 120 can include an insulating material. For example, the gate insulating layer 120 can include an inorganic insulating material, such as silicon oxide (SiOx) and silicon nitride (SiNx).

The interlayer insulating layer 130 can be disposed on the gate insulating layer 120. The interlayer insulating layer 130 can insulate the drain electrodes 225 and the source electrodes 227 of each pixel area PA from the corresponding gate electrode 223. For example, the interlayer insulating layer 130 can cover the first gate electrode and the second gate electrode 223 of each pixel area PA. The first capacitor electrode of each pixel area PA can be covered by the interlayer insulating layer 130. The first drain electrode, the first source electrode, the second drain electrode 225 and the second source electrode 227 of each pixel area PA can be disposed on the interlayer insulating layer 130 of the corresponding pixel area PA. The interlayer insulating layer 130 can include an insulating material. For example, the interlayer insulating layer 130 can include an inorganic insulating material, such as silicon oxide (SiOx) and silicon nitride (SiNx).

The device passivation layer 140 can be disposed on the interlayer insulating layer 130. The device passivation layer 140 can prevent damage of the pixel driving circuit DC in each pixel area PA due to external impact and moisture. For example, the device passivation layer 140 can cover the first drain electrode, the first source electrode, the second drain electrode 225 and the second source electrode 227 of each pixel area PA. The second capacitor electrode of each pixel area PA can be covered by the device passivation layer 140. The device passivation layer 140 can include an insulating material. For example, the device passivation layer 140 can include an inorganic insulating material, such as silicon oxide (SiOx) and silicon nitride (SiNx).

The lower planarization layer 150 can be disposed on the device passivation layer 140. The lower planarization layer 150 can remove a thickness difference due to the pixel driving circuit DC of each pixel area PA. For example, an upper surface of the lower planarization layer 150 opposite to the device substrate 100 can be a flat surface. The lower planarization layer 150 can include an insulating material. The lower planarization layer 150 can include a material different from the device passivation layer 140. For example, the lower planarization layer 150 can be an organic insulating material.

The light-emitting device 300 of each pixel area PA can be disposed on the lower planarization layer 150. The light-emitting device 300 of each pixel area PA can emit light displaying a specific color. For example, the light-emitting device 300 of each pixel area PA can include a first electrode 310, a light-emitting layer 320 and a second electrode 330, which are sequentially stacked on the lower planarization layer 150 of the corresponding pixel area PA.

The first electrode 310 can include a conductive material. The first electrode 310 can include a material having a relative high reflectance. For example, the first electrode 310 can include a metal, such as aluminum (Al) and silver (Ag). The first electrode 310 can have a multi-layer structure. For example, the first electrode 310 can have a structure in which a reflective electrode made of a metal is disposed between transparent electrodes made of a transparent conductive material, such as ITO and IZO.

The light-emitting layer 320 can generate light having luminance corresponding to a voltage difference between the first electrode 310 and the second electrode 330. For example, the light-emitting layer 320 can include an emission material layer (EML) having an emission material. The emission material can include an organic material, an inorganic material or a hybrid material. For example, the display apparatus according to the embodiment of the present disclosure can be an organic light-emitting display apparatus including an organic emission material.

The light-emitting layer 320 can have a multi-layer structure. For example, the light-emitting layer 320 can further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 can be improved.

The second electrode 330 can include a conductive material. The second electrode 330 can include a material different from the first electrode 310. A transmittance of the second electrode 330 can be higher than a transmittance of the first electrode 310. For example, the second electrode 330 can be a transparent electrode made of a transparent conductive material, such as ITO and IZO, or a translucent electrode in which metals such as Ag and Mg are thinly formed. Thus, in the display apparatus according to the embodiment of the present disclosure, the light generated by the light-emitting layer 320 can be emitted outside through the second electrode 330.

The light-emitting device 300 of each pixel area PA can be electrically connected to the second thin film transistor T2 of the corresponding pixel area PA. For example, the first electrode 310 of each pixel area PA can be electrically connected to the second source electrode 227 of the corresponding pixel area PA. The device passivation layer 140 and the lower planarization layer 150 can include electrode contact holes partially exposing the second source electrode 227 of each pixel area PA. The first electrode 310 of each pixel area PA can be in direct contact with the second source electrode 227 of the corresponding pixel area PA through one of the electrode contact holes. The first electrode 310 of each pixel area PA can be in direct contact with the upper surface of the lower planarization layer 150. Thus, in the display apparatus according to the embodiment of the present disclosure, luminance deviation according to the generating location of the light emitted from each light-emitting device 300 can be prevented.

A bank insulating layer 160 can be disposed on the lower planarization layer 150. The bank insulating layer 160 can define an emission area EA in each pixel area PA. For example, the bank insulating layer 160 can cover an edge of the first electrode 310 in each pixel area PA. The light-emitting layer 320 and the second electrode 330 of each pixel area PA can be sequentially stacked on a portion of the corresponding first electrode 310 exposed by the bank insulating layer 160. The first electrode 310 of each pixel area PA can be insulated from the first electrode 310 of adjacent pixel area PA by the bank insulating layer 160. The bank insulating layer 160 can include an insulating material. For example, the bank insulating layer 160 can include an organic insulating material. The bank insulating layer 160 can include a material different from the lower planarization layer 150.

The light emitted from the light-emitting device 300 of each pixel area PA can realize a same color as the light emitted from the light-emitting device 300 of adjacent pixel area PA. For example, the light-emitting device 300 of each pixel area PA can emit white light. The light-emitting layer 320 of each pixel area PA can include a same material as the light-emitting layer 320 of adjacent pixel area PA. The light-emitting layer 320 of each pixel area PA can have a same structure as the light-emitting layer 320 of adjacent pixel area PA. For example, the light-emitting layer 320 of each pixel area PA can be formed simultaneously with the light-emitting layer 320 of adjacent pixel area PA. The light-emitting layer 320 of each pixel area PA can be in direct contact with the light-emitting layer 320 of adjacent pixel area PA. For example, the light-emitting layer 320 of each pixel area PA can extend onto the bank insulating layer 160.

A voltage applied to the second electrode 330 of each pixel area PA can be a same as a voltage applied to the second electrode 330 of adjacent pixel area PA. For example, the second electrode 330 of each pixel area PA can be electrically connected to the second electrode 330 of adjacent pixel area PA. The second electrode 330 of each pixel area PA can include a same material as the second electrode 330 of adjacent pixel area PA. For example, the second electrode 330 of each pixel area PA can be formed simultaneously with the second electrode 330 of adjacent pixel area PA. The second electrode 330 of each pixel area PA can be in direct contact with the second electrode 330 of adjacent pixel area PA. For example, the second electrode 330 of each pixel PA can extend onto the bank insulating layer 160. Thus, in the display apparatus according to the embodiment of the present disclosure, a process of forming the second electrode 330 in each pixel area PA can be simplified. Further, in the display apparatus according to the embodiment of the present disclosure, the luminance of the light emitted from the light-emitting device 300 of each pixel area PA can be adjusted by the data signal applied to the pixel driving circuit DC of the corresponding pixel area PA.

An encapsulation unit 400 can be disposed on the light-emitting device 300 of each pixel area PA. The encapsulation unit 400 can prevent damages of the light-emitting devices 300 due to external moisture and impact. For example, the light-emitting device 300 of each pixel rea PA can be completely covered by the encapsulation unit 400. The encapsulation unit 400 can have a multi-layer structure. For example, the encapsulation unit 400 can have a stacked structure of a first encapsulating layer 410, a second encapsulating layer 420 and a third encapsulating layer 430. The first encapsulating layer 410, the second encapsulating layer 420 and the third encapsulating layer 430 can include an insulating material. The second encapsulating layer 420 can include a material different from the first encapsulating layer 410 and the third encapsulating layer 430. For example, the first encapsulating layer 410 and the third encapsulating layer 430 can include an inorganic insulating material, such as silicon oxide (SiOx) and silicon nitride (SiNx), and the second encapsulating layer 420 can include an organic insulating material. Thus, in the display apparatus according to the embodiment of the present disclosure, the damages of the light-emitting devices 300 due to external moisture and impact can be effectively prevented. An upper surface of the encapsulation unit 400 opposite to the device substrate 100 can be a flat surface.

Each of the pixel area PA can realize a color different from adjacent pixel area PA. For example, a color conversion unit 500 can be disposed on the encapsulation unit 400. The color conversion unit 500 can various colors using the light emitted from the light-emitting device 300 of each pixel area PA. For example, the color conversion unit 500 can include color filters 510 overlapping with the light-emitting device 300 of each pixel area PA. Each of the color filters 510 can overlap the emission area EA of one of the pixel areas PA. Thus, in the display apparatus according to the embodiment of the present disclosure, a color of each pixel area PA can be realized by the color filter 510 disposed in the corresponding pixel area PA.

The color conversion unit 500 can include a black matrix 520 disposed side by side with the color filters 510. The black matrix 520 can include openings overlapping with the emission area EA of each pixel area PA. For example, the black matrix 520 can overlap the bank insulating layer 160. The color filters 510 can be disposed in the openings of the black matrix 520. The black matrix 520 can block the light emitted from the light-emitting device 300 of each pixel area PA toward the color filter 510 of adjacent pixel area PA. Thus, in the display apparatus according to the embodiment of the present disclosure, mixed color can be prevented by the black matrix 520. The color filter 510 of each pixel area PA can have a size larger than the emission area EA of the corresponding pixel area PA. For example, an edge of each color filter 510 can overlap the black matrix 520. Therefore, in the display apparatus according to the embodiment of the present disclosure, the light which does not pass through one of the color filters 510 can be not emitted outside. For example, in the display apparatus according to the embodiment of the present disclosure, light leakage due to the light which does not pass through the color filters 510 can be prevented.

The color filters 510 and the black matrix 520 can be in direct contact with the upper surface of the encapsulation unit 400 opposite to the device substrate 100. Thus, in the display apparatus according to the embodiment of the present disclosure, a difference in paths of the light incident to the color filter 510 of each pixel area PA can be prevented. The color conversion unit 500 can include a color planarization layer 530 on the color filters 510 and the black matrix 520. A thickness difference due to the color filters 510 and the black matrix 520 can be removed by the color planarization layer 530. For example, an upper surface of the color planarization layer 530 opposite to the device substrate 100 can be a flat surface. The color planarization layer 530 can include an insulating material. For example, the color planarization layer 530 can include an organic insulating material. The color planarization layer 530 can include a same material as the lower planarization layer 150. Thus, in the display apparatus according to the embodiment of the present disclosure, a difference in the paths of the light passing through the color filter 510 of each pixel area PA can be prevented. For example, in the display apparatus according to the embodiment of the present disclosure, a deviation in color sense due to the difference in the paths of the light emitted from the light-emitting device 300 of each pixel area PA can be prevented.

An optical unit 600 can be disposed on the color conversion unit 500. The optical unit 600 can condense the light passing through the color conversion unit 500. For example, the optical unit 600 can include optical lenses 610 disposed side by side on the color planarization layer 530. A cross-section of an upper surface of each optical lens 610 opposite to the device substrate 100 can have a semi-circular shape. The optical lenses 610 can be disposed on the pixel areas PA. For example, the optical lens 610 of each pixel area PA can overlap the emission area EA defined in the corresponding pixel area PA. The color filter 510 of each pixel area PA can be disposed between the light-emitting device 300 and the optical lens 610 of the corresponding pixel area PA. The optical lens 610 of each pixel area PA can have a width larger than the emission area EA of the corresponding pixel area PA. For example, a width 610$w$ of the optical lens 610 on each pixel area PA can be larger than the opening of the black matrix 520 on the corresponding pixel area PA. An edge of the optical lens 610 on each pixel area PA can overlap the black matrix 520. Thus, in the display apparatus according to the embodiment of the present disclosure, the light passing through the color filter 510 of each pixel area PA can be condensed by the optical lens 610 of the corresponding pixel area PA. Therefore, in the display apparatus according to the embodiment of the present disclosure, frontal luminance and light-extraction efficiency of each pixel area PA can be improved by the optical lenses 610.

Figure 4:
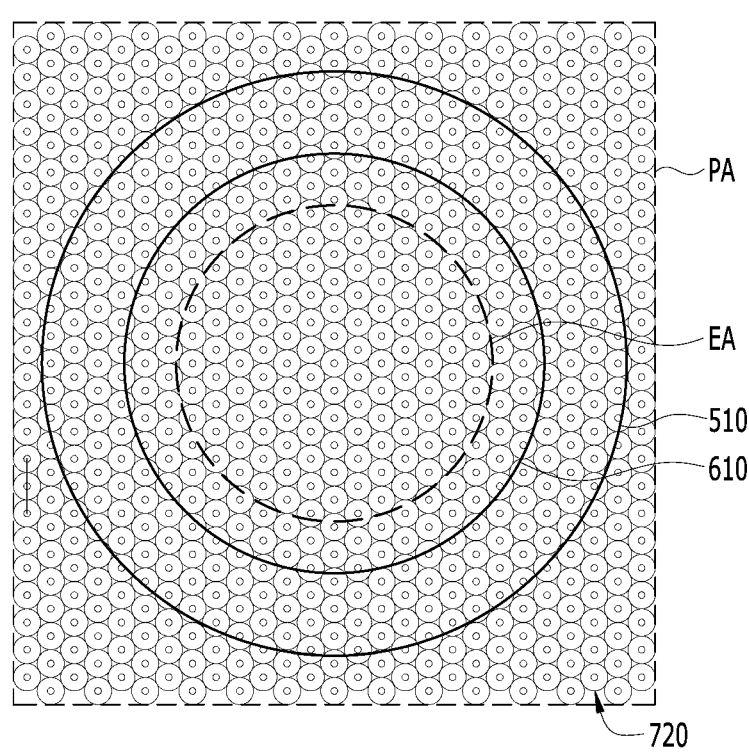
FIG. 4 is a top view showing a unit pixel area in the display apparatus according to the embodiment of the present disclosure.

A lower surface of each optical lens 610 toward the device substrate 100 can be in direct contact with the upper surface of the color planarization layer 530. Thus, in the display apparatus according to the embodiment of the present disclosure, a difference in paths of the light incident to the optical lens 610 of each pixel area PA can be prevented. A plane of the lower surface of the optical lens 610 in each pixel area PA can have a shape corresponding to a plane of the emission area EA defined in the corresponding pixel area PA. For example, the plane of the emission area EA defined in each pixel area PA can be a circle shape, and a plane of the color filter 510 and the plane of the lower surface of the optical lens 610 on each pixel area PA can be made of concentric circles with the plane of the emission area EA defined in the corresponding pixel area PA, as shown in FIG. 4. Therefore, in the display apparatus according to the embodiment of the present disclosure, luminance deviation according to azimuth angle can be prevented.

The optical unit 600 can include a lens passivation layer 620 disposed on the optical lenses 610, as shown in FIG. 3. The lens passivation layer 620 can prevent damage of the optical lenses 610 due to external impact. For example, each of the optical lenses 610 can be completely covered by the lens passivation layer 620. The upper surface of each optical lens 610 having a hemi-spherical shape can be in direct contact with the lens passivation layer 620. Thus, in the display apparatus according to the embodiment of the present disclosure, a difference in paths of the light passing through the optical lens 610 of each pixel area PA can be prevented. The lens passivation layer 620 can include an insulating material. For example, the lens passivation layer 620 can include an organic insulating material. A thickness difference due to the optical lenses 610 can be removed by the lens passivation layer 620. For example, an upper surface of the lens passivation layer 620 opposite to the device substrate 100 can be a flat surface. Therefore, in the display apparatus according to the embodiment of the presentent disclosure, a deviation in color sense due to the difference in the paths of the light emitted outside from the light-emitting device 300 of each pixel area PA can be prevented.

The lens passivation layer 620 can have a refractive index same as or larger than each optical lens 610. Thus, in the display apparatus according to the embodiment of the present disclosure, reflection of the light passing through each optical lens 610 due to a difference in the refractive index between the corresponding pixel lens 610 and the lens passivation layer 620 can be prevented. For example, in the display apparatus according to the embodiment of the present disclosure, the light passing through each optical lens 610 can be not reflected toward the device substrate 100 at a boundary surface between the corresponding optical lens 610 and the lens passivation layer 620. Therefore, in the display apparatus according to the embodiment of the present disclosure, decrease in the light-extraction efficiency due to the difference in the refractive index between the corresponding pixel lens 610 and the lens passivation layer 620 can be prevented.

A device planarization layer 710 can be disposed between the light-emitting device 300 of each pixel area PA and the encapsulation unit 400. The device planarization layer 710 can extend beyond the emission area EA defined in each pixel area PA. For example, the device planarization layer 710 can include a region overlapping with the bank insulating layer 160. The device planarization layer 710 can remove or mitigate a thickness difference due to the light-emitting device 300 of each pixel area PA. For example, an upper surface of the device planarization layer 710 toward the encapsulation unit 400 can be a flat surface. The device planarization layer 710 can include an insulating material. For example, the device planarization layer 710 can include an organic insulating material. The device planarization layer 710 can include a same material as the lower planarization layer 150 and the color planarization layer 530.

A plurality of micro-lenses 720 can be disposed between the device planarization layer 710 and the encapsulation unit 400. The plurality of the micro-lenses 720 can diffuse the light emitted from the light-emitting device 300 of each pixel area PA. For example, the plurality of the micro-lenses 720 can be disposed side by side between the device passivation layer 710 and the encapsulation unit 400. Some of the micro-lenses 720 can be disposed between adjacent pixel areas PA. An upper surface of each micro-lens 720 toward the encapsulation unit 400 can be covered by the first encapsulating layer 410 of the encapsulation unit 400. For example, the first encapsulating layer 410 can be formed in a concave-convex shape by the plurality of the micro-lenses 720. A thickness difference due to the plurality of the micro-lenses 720 can be removed by the second encapsulating layer 420 of the encapsulation unit 400. A lower surface of each micro-lens 720 toward the device substrate 100 can be in direct contact with the device planarization layer 710.

The plurality of the micro-lenses 720 can include an insulating material. The plurality of the micro-lenses 720 can include a transparent material. The plurality of the micro-lenses 720 can include a material different from the device planarization layer 710.

The plurality of the micro-lenses 720 can be uniformly arranged in each pixel area PA. A plane of the lower surface of each micro-lens 720 can have a circle shape. For example, a planar arrangement of the micro-lenses 720 can be a hexagonal shape, as shown in FIG. 4. Thus, in the display apparatus according to the embodiment of the present disclosure, deviation in amount of light due to the plurality of the micro-lenses 720 on each pixel area PA can be prevented. Therefore, in the display apparatus according to the embodiment of the present disclosure, luminance deviation according to a viewing angle and an azimuth angle can be prevented.

Figure 5:
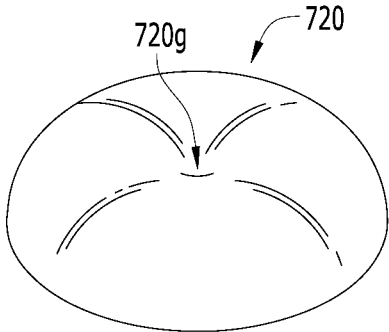
FIG. 5 is a view showing a single micro-lens in the display apparatus according to the embodiment of the present disclosure.
Figure 6:
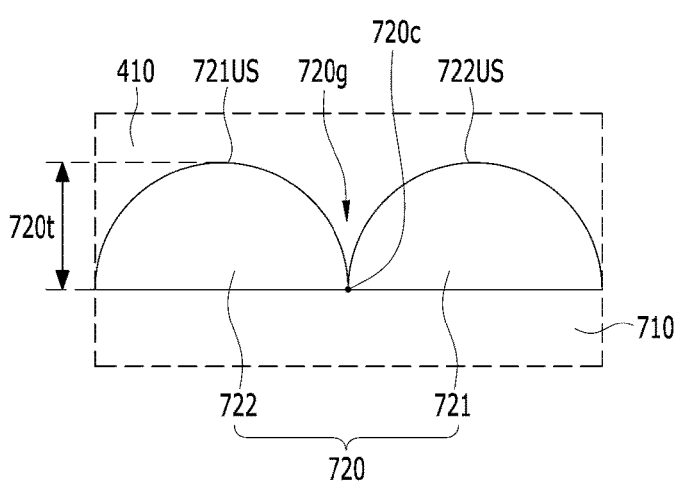
FIG. 6 is a view showing a cross-section of each micro-lens in the display apparatus according to the embodiment of the present disclosure.

FIG. 5 is a view showing an example of a single micro-lens in the display apparatus according to the embodiment of the present disclosure. FIG. 6 is a view showing a cross-section of each micro-lens in the display apparatus according to the embodiment of the present disclosure.

Referring to FIGS. 5 and 6, each of the micro-lenses 720 can include a lens groove 720g. The lens groove 720g of each micro-lens 720 can have a concave shape toward a lens center 720c of the corresponding micro-lens 720. The lens groove 720g of each micro-lens 720 can have a symmetrical shape in plane. For example, the lens groove 720g of a conical shape can be disposed at the upper surface of each micro-lens 720 toward the encapsulation unit 400.

A cross-section of each micro-lens 720 can have a shape in which two curved surfaces 721us and 722us are disposed symmetrically with respect to the corresponding lens groove 720g. The lens groove 720g of each micro-lens 720 can be in direct contact with the lens center 720c of the corresponding micro-lens 720. For example, a cross-section of each micro-lens 720 can be a shape in which a first sub-lens 721 having a first curved surface 721us and a second sub-lens 722 having a second curved surface 722us are disposed side by side. The lens groove 720g of each micro-lens 720 can have a conical shape with a concave side. The second sub-lens 722 of each micro-lens 720 can have a same size as the first sub-lens 721 of the corresponding micro-lens 720. For example, the first sub-lens 721 and the second sub-lens 722 of each micro-lens 720 can have a hemi-spherical shape having the maximum thickness 720t of the corresponding micro-lens 720 as a radius. Thus, in the display apparatus according to the embodiment of the present disclosure, luminance deviation according to an azimuth angle can be prevented by each micro-lens 720.

Figure 7:
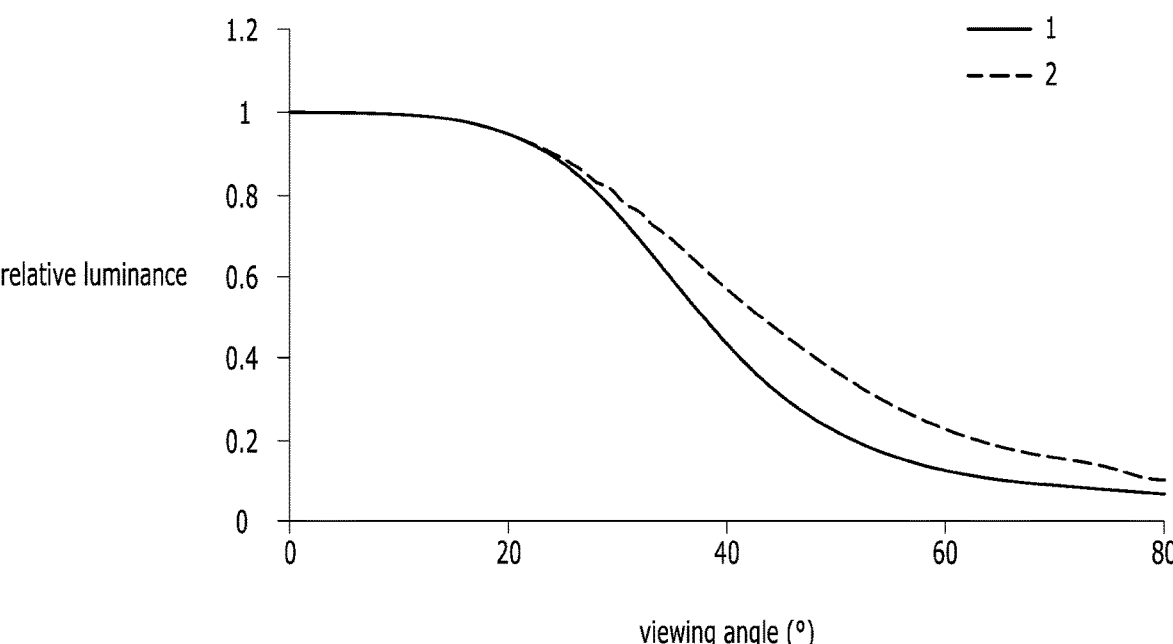
FIG. 7 is a graph showing an example of luminance according to a viewing angle depending on whether micro-lenses are disposed between a light-emitting device of each pixel area and an encapsulation unit.
Figures 8, 9:
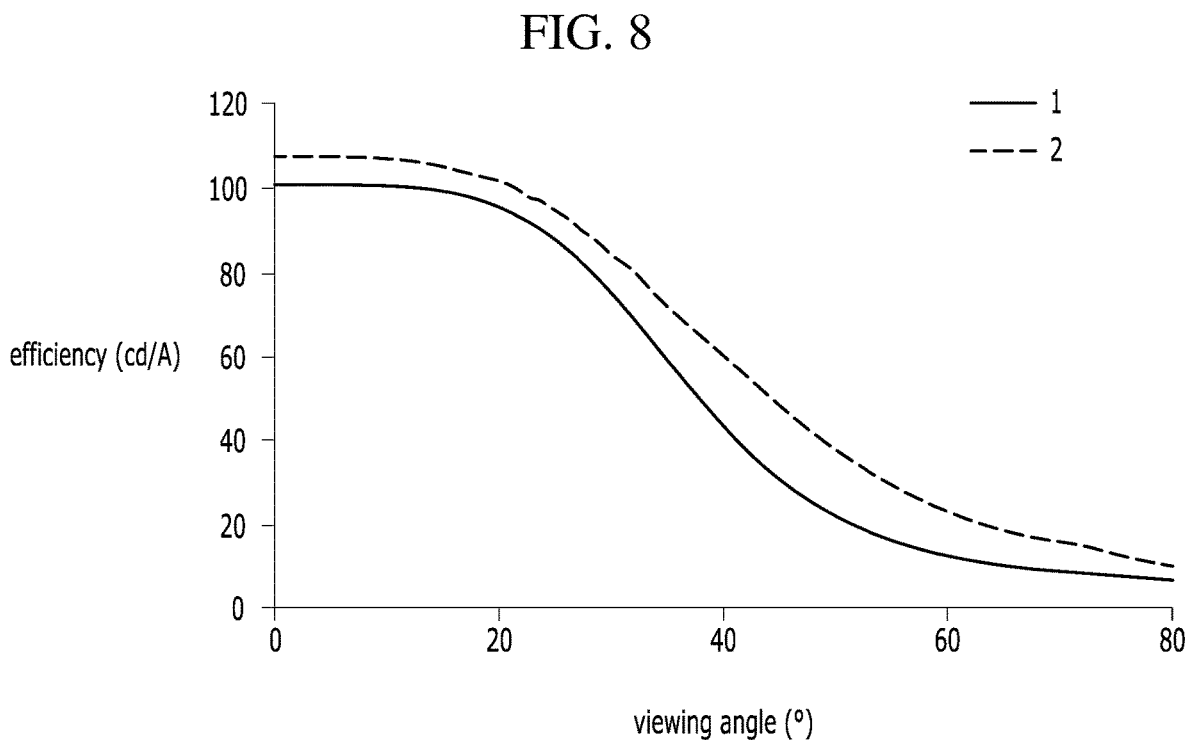
FIG. 8 is a graph showing an example of efficiency according to a viewing angle depending on whether micro-lenses are disposed between a light-emitting device of each pixel area and an encapsulation unit.
FIG. 9 is a view showing a cross-section of each micro-lens in the display apparatus according to another embodiment of the present disclosure.

FIG. 7 is a graph showing an example of luminance of a first display apparatus 1 in which the micro-lenses 720 are not arranged between the light-emitting device 300 of each pixel area PA and the encapsulation unit 400, and a second display apparatus 2 in which the micro-lenses 720 are arranged between the light-emitting device 300 of each pixel area PA and the encapsulation unit 400, according to a viewing angle. FIG. 8 is a graph showing an example of efficiency of the first display apparatus 1 and the second display apparatus 2 according to a viewing angle.

Referring to FIGS. 7 and 8, the second display apparatus 2 can have luminance and efficiency according to a viewing angle higher than the first display apparatus 1. Thus, in the display apparatus according to the embodiment of the present disclosure, luminance and efficiency according to a viewing angle can be improved by the plurality of the micro-lenses 720 disposed between the device passivation layer 710 and the encapsulation unit 400. For example, in the display apparatus according to the embodiment of the present disclosure, luminance and efficiency of the light emitted from the light-emitting device 300 of each pixel area PA according to a viewing angle can be improved by the plurality of the micro-lenses 720.

Accordingly, the display apparatus according to the embodiment of the present disclosure can comprise the plurality of the micro-lenses 720 on the light-emitting device 300 of each pixel area PA, the color filter 510 on the plurality of the micro-lenses 720, the black matrix 520 disposed side by side the color filter 510, and the optical lens 610 on the color filter 510, wherein the upper surface of each micro-lens 720 can include the lens groove 720g of a conical shape with a concave side. Thus, in the display apparatus according to the embodiment of the present disclosure, luminance and efficiency according to a viewing angle can be improved. Therefore, in the display apparatus according to the embodiment of the present disclosure, the decrease in the quality of the image according to viewing location of the user can be mitigated.

The display apparatus according to the embodiment of the present disclosure is described that the pixel driving circuit DC of each pixel area PA consists of the first thin film transistor T1, the second thin film transistor T2 and the storage capacitor Cst. However, in the display device according to another embodiment of the present disclosure, the pixel driving circuit DC of each pixel area PA can include at least one thin film transistor. For example, in the display device according to another embodiment of the present disclosure, the pixel driving circuit DC of each pixel area PA can include the first thin film transistor T1, the second thin film transistor T2, a third thin film transistor, and the storage capacitor Cst. The third thin film transistor can reset the storage capacitor Cst according to the gate signal. For example, the third thin film transistor can be electrically connected between a reference voltage supply line and the storage capacitor Cst. Thus, in the display apparatus according to another embodiment of the present disclosure, the degree of freedom in configuring the pixel driving circuit DC in each pixel area PA can be improved.

In the display apparatus according to the embodiment of the present disclosure, the location and the electric connection of the drain electrodes 225 and the source electrode 227 in each pixel area PA can vary depending on the configuration of the pixel driving circuit DC and/or the type of the corresponding thin film transistors T1 and T2 in the corresponding pixel area PA. For example, in the display apparatus according to another embodiment of the present disclosure, the second gate electrode 223 of the second thin film transistor T2 in each pixel area PA can be electrically connected to the first drain electrode of the first thin film transistor T1 in the corresponding pixel area PA. Thus, in the display apparatus according to another embodiment of the present disclosure, the degree of freedom in the configuration of the pixel driving circuit DC in each pixel area PA and the type of the thin film transistors T1 and T2 included in each pixel driving circuit DC can be improved.

The display apparatus according to the embodiment of the present disclosure is described that the lens groove 720g of each micro-lens 720 contacts the lens center 720c of the corresponding micro-lens 720. However, in the display apparatus according to another embodiment of the present disclosure, the lens groove 720g of each micro-lens 720 can be spaced apart from the lens center 720c of the corresponding micro-lens 720, as shown in FIG. 9.

Figure 10:
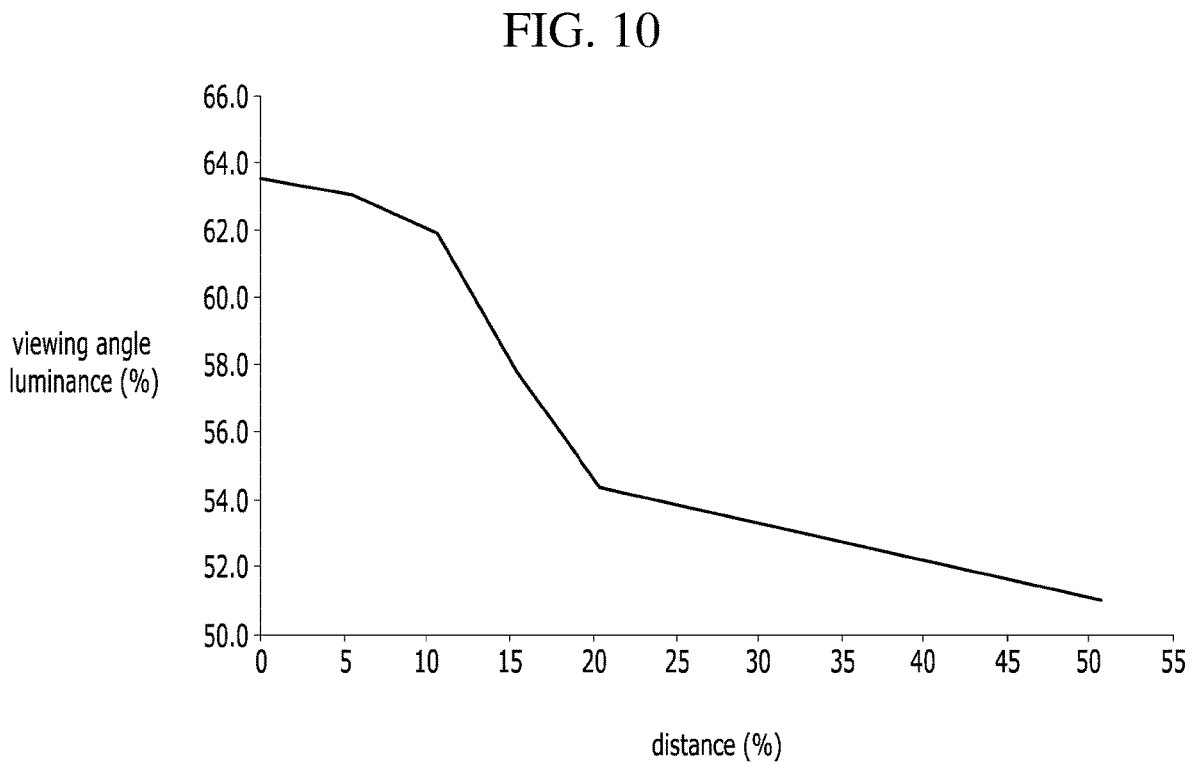
FIG. 10 is a graph showing an example of viewing angle luminance according to a distance between a lens center and a lens groove in each micro-lens.

FIG. 10 is a graph showing an example of viewing angle luminance according to a distance d between the lens center 720c and the lens groove 702g of each micro-lens 720 in the display apparatus according to another embodiment of the present disclosure. Herein, the distance d between the lens center 720c and the lens groove 702g of each micro-lens 720 is a relative distance with respect to the maximum thickness of the corresponding micro-lens 720, and the viewing angle luminance is a luminance change rate measured at an angle of 45° with respect to the upper surface of the device substrate 100.

Referring to FIGS. 9 and 10, in the display apparatus according to another embodiment of the present disclosure, the viewing angle luminance can be not greatly reduced, when the distance d between the lens center 720c and the lens groove 702g of each micro-lens 720 is 10% or less of the maximum thickness of the corresponding micro-lens 720. For example, in the display apparatus according to another embodiment of the present disclosure, the distance d between the lens center 720c and the lens groove 702g of each micro-lens 720 can be 0% to 10% of the maximum thickness of the corresponding micro-lens 720. Thus, in the display apparatus according to another embodiment of the present disclosure, the degree of freedom in shape and a forming process of each micro-lens 720.

Figure 11:
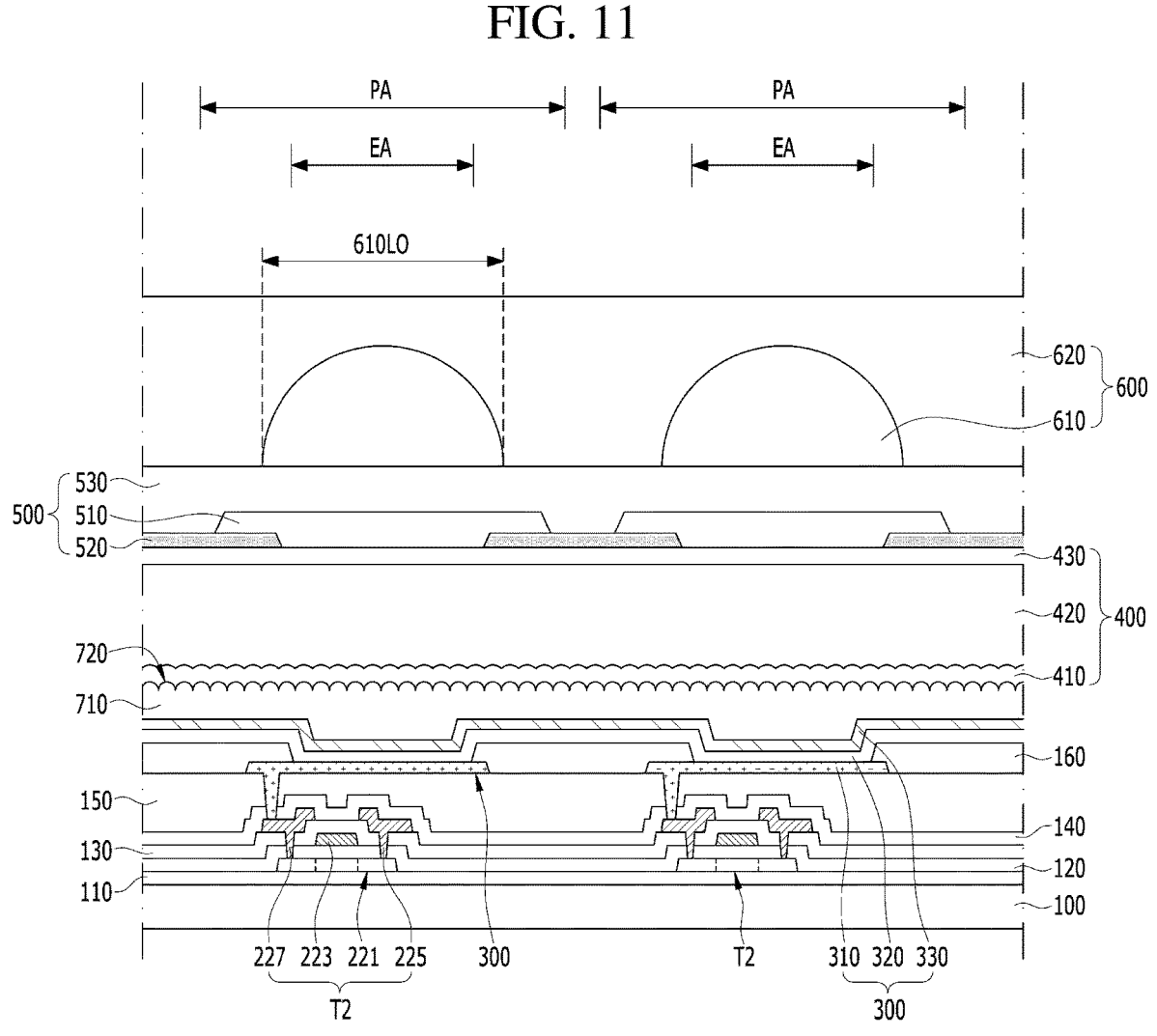

The display apparatus according to the embodiment of the present disclosure is described that the plurality of the micro-lenses 720 includes a material different from the device planarization layer 710. However, in the display apparatus according to another embodiment of the present disclosure, the plurality of the micro-lenses 720 can include a same material as the device planarization layer 710. For example, in the display apparatus according to another embodiment of the present disclosure, a boundary surface between each micro-lens 720 and the device planarization layer 710 can be not recognized, as shown in FIG. 11. Thus, in the display apparatus according to another embodiment of the present disclosure, the degree of freedom in a forming material of each micro-lens 720.

Figure 12:
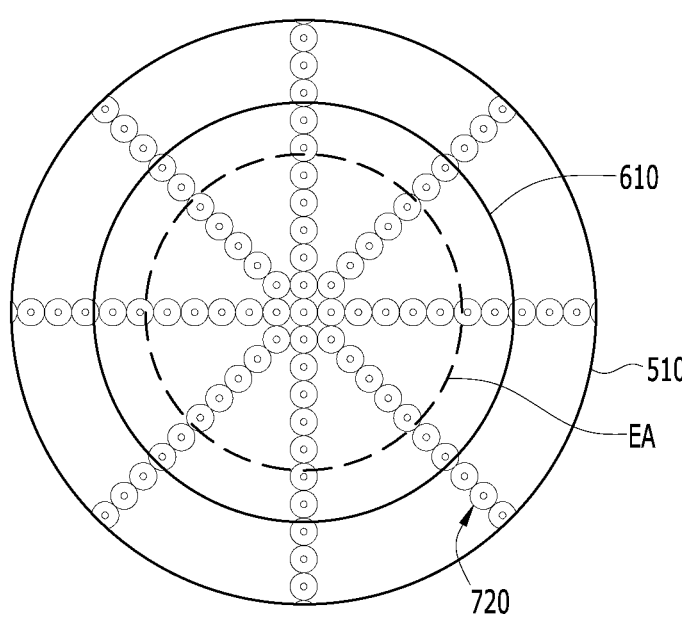
Figure 13:
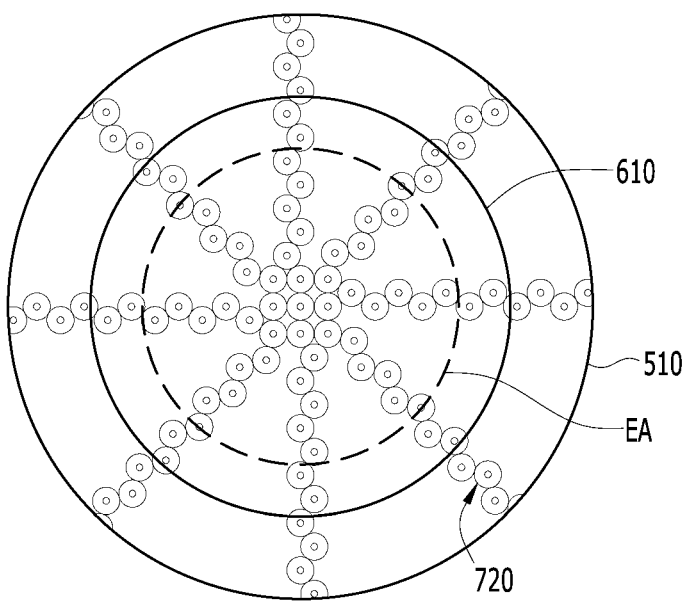
Figure 15:
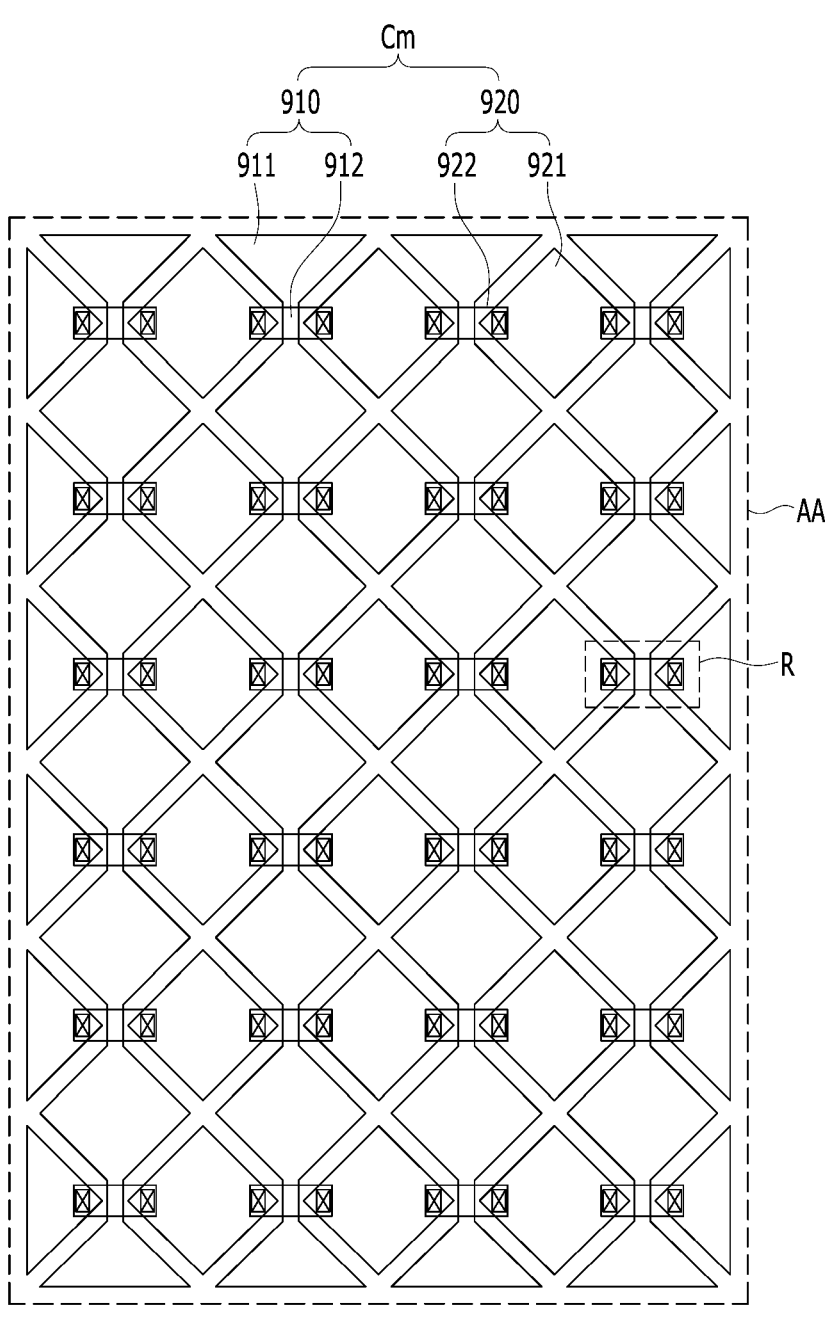

The display apparatus according to the embodiment of the present disclosure is described that the planar arrangement of the micro-lenses 720 is a hexagonal shape. However, in the display apparatus according to another embodiment of the present disclosure, the plurality of the micro-lenses 720 in each pixel area PA can be arranged in various shapes. For example, in the display apparatus according to another embodiment of the present disclosure, a planar arrangement of the micro-lenses 720 in each pixel area PA can have a radial shape, as shown in FIG. 12. Alternately, in the display apparatus according to another embodiment of the present disclosure, a planar arrangement of the micro-lenses 720 in each pixel area PA can have a radial shape, wherein the micro-lenses 720 in each direction can be arranged in a zig-zag shape, as shown in FIG. 13. Table 1 can show the viewing angle luminance according to the planar arrangement of the micro-lenses 720 in the display apparatus according to another embodiment of the present disclosure. Herein, the viewing angle luminance is a luminance change rate measured at an angle of 45° with respect to the upper surface of the device substrate 100.

TABLE 1

| planar arrangement of the micro-lenses | X | hexagonal shape | radial shape | Zig-zag shape in radial direction |
|---|---|---|---|---|
| viewing angle luminance | 42.3% | 63.6% | 62.7% | 62.1% |

Referring to Table 1, in the display apparatus according to another embodiment of the present disclosure, a relatively high viewing angle luminance can be maintained, regardless of the planar arrangement of the micro lenses 720 in each pixel area PA. Therefore, in the display apparatus according to another embodiment of the present disclosure, the degree of freedom in the planar arrangement of the micro-lenses 720 can be improved.

Figure 17:
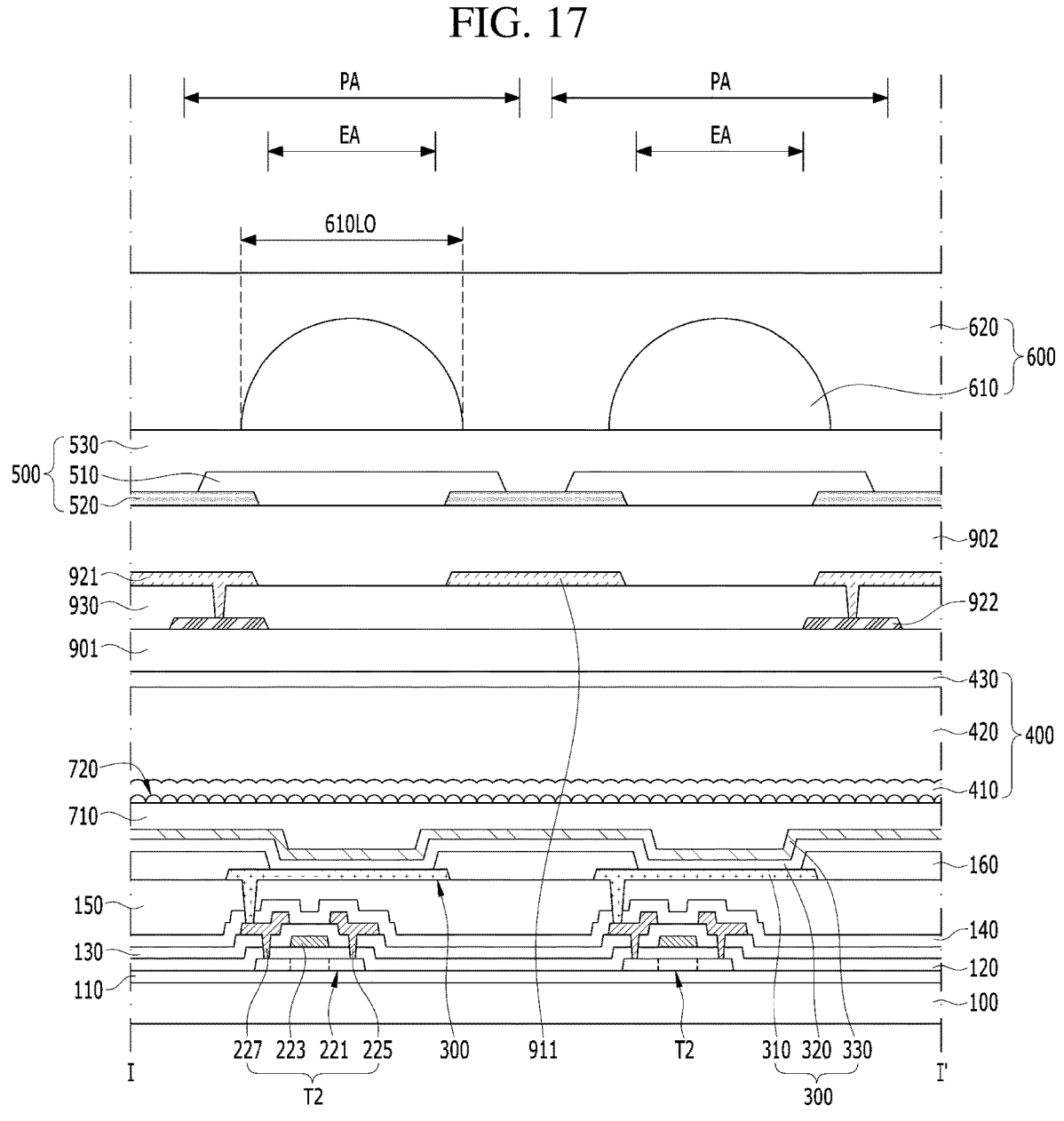

The display apparatus according to another embodiment of the present disclosure can sense a touch of the user and/or a tool. For example, the display apparatus according to another embodiment of the present disclosure can include a touch sensor Cm, as shown in FIGS. 14 to 17 where FIG. 17 shows a cross-sectional view taken along line I-I' of FIG. 16. The touch sensor Cm can sense the presence or absence of a touch and a touch position by a change of the mutual capacitance. For example, the touch sensor Cm can include driving touch lines 910 in which a touch driving signal is applied and sensing touch lines 920 in which a touch sensing signal is applied.

Each of the driving touch lines 910 can include first touch electrodes 911 and first bridge electrodes 912. The first bridge electrodes 912 can electrically connect between the first touch electrodes 911. For example, each of the driving touch lines 910 can include the first touch electrodes 911 electrically connected in a direction by the first bridge electrodes 912.

Each of the sensing touch lines 920 can include second touch electrodes 921 and second bridge electrodes 922. The second touch electrodes 921 can be disposed between the first touch electrodes 911. For example, the first touch electrodes 911 and the second touch electrodes 921 can be alternately arranged. Thus, the display apparatus according to another embodiment of the present disclosure can sense the touch of the user and/or the tool by using the driving touch lines 910 and the sensing touch lines 920.

The second bridge electrodes 922 can electrically connect between the second touch electrodes 921. The second touch electrodes 921 can be connected by the second bridge electrodes 922 in a direction perpendicular to the first touch electrodes 911. For example, each of the sensing touch lines 920 can cross the driving touch lines 910. Each of the second bridge electrodes 922 can intersect one of the first bridge electrodes 912. The second bridge electrodes 922 can be disposed on a layer different from the first bridge electrodes 912. For example, in the display apparatus according to another embodiment of the present disclosure, a touch buffer layer 901 can be disposed on the encapsulation unit 400, the second bridge electrodes 922 can be disposed on the touch buffer layer 901, the first touch electrodes 911, the second touch electrodes 921 and the first bridge electrodes 912 can be disposed on a touch insulating layer 930 covering the second bridge electrodes 922, and the color conversion unit 500 can be disposed on a touch passivation layer 902 covering the first touch electrodes 911, the second touch electrodes 921 and the first bridge electrodes 912. The touch buffer layer 901, the touch insulating layer 930 and the touch passivation layer 902 can include an insulating material. For example, the touch buffer layer 901, the touch insulating layer 930 and the touch passivation layer 902 can include an inorganic insulating material, such as silicon oxide (SiOx) and silicon nitride (SiNx). The touch buffer layer 901, the touch insulating layer 930 and the touch passivation layer 902 can include different materials.

The first touch electrodes 911, the first bridge electrodes 912, the second touch electrodes 921 and the second bridge electrodes 922 can include a conductive material. The first touch electrodes 911, the first bridge electrodes 912, the second touch electrodes 921 and the second bridge electrodes 922 can include a material having a relatively low resistance. For example, The first touch electrodes 911, the first bridge electrodes 912, the second touch electrodes 921 and the second bridge electrodes 922 can include a metal, such as copper (Cu), molybdenum (Mo), titanium (Ti) and tantalum (Ta).

The first touch electrodes 911, the first bridge electrodes 912, the second touch electrodes 921 and the second bridge electrodes 922 can be disposed in the display area AA. The emission area EA of each pixel area PA defined by the bank insulating layer 160 can be disposed between the first touch electrodes 911, the first bridge electrodes 912, the second touch electrodes 921 and the second bridge electrodes 922. For example, the first touch electrodes 911, the first bridge electrodes 912, the second touch electrodes 921 and the second bridge electrodes 922 can overlap the bank insulating layer 160. The black matrix 510 can overlap the first touch electrodes 911, the first bridge electrodes 912, the second touch electrodes 921 and the second bridge electrodes 922.

A plane of each first touch electrode 911 and a plane of each second touch electrode 921 can have a mesh shape including openings overlapping with the emission area EA of each pixel area PA. Thus, in the display apparatus according to another embodiment of the present disclosure, the accuracy of the touch sensing using the touch sensor Cm can be improved, and the decrease in light-extraction efficiency due to the driving touch lines 910 and the sensing touch lines 920 can be minimized. Further, in the display apparatus according to another embodiment of the present disclosure, a traveling direction of the light emitted from each light-emitting device 300 can be restricted by the driving touch lines 910 and the sensing touch lines 920. Therefore, in the display apparatus according to another embodiment of the present disclosure, the touch of the user and/or the tool can be accurately sensed, and the luminance and the efficiency according to viewing angle can be improved.

In the result, the display apparatus according to the embodiments of the present disclosure can comprise the light-emitting device, the device planarization layer, the plurality of the micro-lenses, the color filter, the black matrix and the optical lens, wherein the color filter and the optical lens can overlap the light-emitting device, wherein the black matrix can be disposed side by side with the color filter between the light-emitting device and the optical lens, and wherein the upper surfaced of each micro-lens toward the color filter can include the lens groove having a conical shape with a concave side. Thus, in the display apparatus according to the embodiments of the present disclosure, the luminance and the efficiency of the light emitted from each light-emitting device according to the viewing angle can be improved. Thereby, in the display apparatus according to the embodiments of the present disclosure, the degree in the quality of the image due to the viewing location of the user can be mitigated. Further, in the display apparatus according to the embodiments of the present disclosure, power consumption for the operation of the light-emitting device disposed in each pixel area can be reduced. For example, in the display apparatus according to the embodiments of the present disclosure, low power driving can be possible.

What is claimed is:

1. A display apparatus comprising:
   a bank insulating layer on a device substrate, the bank insulating layer defining an emission area in a pixel area;
   a light-emitting device on the emission area of the device substrate;
   a device planarization layer on the bank insulating layer and the light-emitting device;
   a plurality of micro-lenses on the device planarization layer of the pixel area;
   a color filter on the plurality of the micro-lenses, the color filter overlapping with the emission area;

a black matrix disposed side by side with the color filter, the black matrix overlapping with the bank insulating layer; and an optical lens on the color filter, the optical lens overlapping with the emission area, wherein an upper surface of each micro-lens opposite to the device substrate includes a lens groove having a conical shape with a concave side.

2. The display apparatus according to claim 1, wherein a cross-section of each micro-lens has a shape in which two curved surfaces are disposed symmetrically with respect to the corresponding lens groove.

3. The display apparatus according to claim 1, wherein a plane of a lower surface of each micro-lens toward the device substrate has a circular shape.

4. The display apparatus according to claim 3, wherein a plane of an upper surface of each micro-lens has a ring shape.

5. The display apparatus according to claim 3, wherein a planar arrangement of the plurality of micro-lenses has a hexagonal shape.

6. The display apparatus according to claim 1, wherein the plurality of micro-lenses include a same material as the device planarization layer.

7. The display apparatus according to claim 1, wherein the lens groove of each micro-lens is spaced apart from a lens center of the corresponding micro-lens.

8. The display apparatus according to claim 7, wherein a distance between the lens center and the lens groove in each micro-lens is about 10% or less than a maximum thickness of the corresponding micro-lens.

9. The display apparatus according to claim 1, wherein an edge of one of the plurality of micro-lenses is vertically aligned with an edge of the optical lens.

10. The display apparatus according to claim 1, wherein the bank insulating layer includes a black dye.

11. The display apparatus according to claim 1, further comprising a color planarization layer covering the color filter and the black matrix, wherein a lower surface of the optical lens toward the device substrate contacts the color planarization layer.

12. The display apparatus according to claim 1, further comprising:

an encapsulation unit between the plurality of micro-lenses and the color filter, the encapsulation unit extending between the plurality of micro-lenses and the black matrix; and a plurality of touch electrodes between the encapsulation unit and the black matrix.

13. The display apparatus according to claim 1, wherein at least two of a top outer line of the emission area, a top outer line of the color filter and a top outer line of the optical lens are concentric to each other.

14. The display apparatus according to claim 1, wherein at least two of a top outer line of the emission area, a top outer line of the color filter and a top outer line of the optical lens form concentric circles.

15. The display apparatus according to claim 1, further comprising:

a lens passivation layer on the optical lens, wherein the lens passivation layer has a refractive index that is equal to or larger than a refractive index of the optical lens.

* * * * *